United States Patent
Sirito-Olivier

(10) Patent No.: US 6,172,574 B1
(45) Date of Patent: *Jan. 9, 2001

(54) QUARTZ CRYSTAL OSCILLATOR FREQUENCY MODULATION CIRCUIT

(75) Inventor: Philippe Sirito-Olivier, Saint Egreve (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/010,294

(22) Filed: Jan. 21, 1998

(30) Foreign Application Priority Data

Jan. 24, 1997 (FR) .................................. 97 00969

(51) Int. Cl.$^7$ ....................................................... H03C 3/10
(52) U.S. Cl. ................... 331/116 R; 331/158; 331/36 C; 332/100; 332/117
(58) Field of Search .................................. 331/116 R, 65, 331/36 C, 158, 177 V; 332/100, 120, 136, 117, 119

*Primary Examiner*—Arnold Kinkead
(74) *Attorney, Agent, or Firm*—Wolf, Greenfield & Sacks, P.C.; James H. Morris; Theodore E. Galanthay

(57) ABSTRACT

The present invention relates to a voltage-controlled quartz crystal oscillator, including an oscillation transistor, the base of which is connected to a first terminal of a quartz crystal and the emitter of which is connected, via a first capacitor, to a second terminal of the quartz crystal connected to a first supply terminal, and including an active circuit introducing a variable capacitance between the base and the emitter of the oscillation transistor, the active circuit being voltage-controlled.

42 Claims, 4 Drawing Sheets

QUARTZ CRYSTAL OSCILLATOR FREQUENCY MODULATION CIRCUIT

BACKGROUND OF THE INVENTION

1. Field of the Invention

The present invention relates to voltage-controlled quartz crystal oscillators (VCXO) and, more specifically, to an integrated circuit for modulating, with a voltage-controlled phase modulation loop, the frequency of a quartz crystal oscillator.

2. Discussion of the Related Art

There are several solutions to modulate the frequency of a voltage-controlled quartz crystal oscillator.

FIGS. 1 and 2 show two conventional examples of voltage-controlled quartz crystal oscillators, based on structures of Colpitts type. FIG. 1 shows a Colpitts-type oscillator in which the frequency is modulated, discreetly, by switching capacitors in series with the quartz crystal. FIG. 2 shows an example of Colpitts-type oscillator in which the frequency is modulated, linearly, by means of a variable-capacitance diode (varicap).

A Colpitts-type oscillator is, for example, formed of an NPN-type oscillation transistor To, the collector of which is connected to a first terminal A of positive supply Vcc, and the emitter of which is connected to the midpoint B of a series association of two capacitors Cbe and Ce between the base of transistor To and a second supply terminal M, generally connected to the ground. A first terminal of a quartz crystal 1 is connected to the base of transistor To which forms a terminal S of output of the oscillating signal. When a modulation of the oscillation frequency is desired, a second terminal of the quartz crystal is connected to terminal M via a capacitive modulation circuit, respectively 2 (FIG. 1) or 2' (FIG. 2). Biasing resistors Rb, Re, are generally provided between terminal S and terminal A and between the emitter of transistor To and terminal M. A Colpitts-type oscillator can also be implemented with other types of oscillators (PNP, JFET, . . . ).

The operation of a Colpitts-type oscillator is well known. For the assembly to oscillate, two conditions must be met. A first condition is that the resistance seen from quartz crystal 1 has to be, in absolute value, higher than its own series resistance. A second condition is that the resistance seen from the quartz crystal has to be negative. The function of transistor To and of capacitors Cbe and Ce is precisely to create a negative resistance between terminals B and M. The oscillation frequency is determined by the equivalent capacitance of the parallel assembly on quartz crystal 1.

The assembly shown in FIG. 1 is more specifically meant for frequency shift keying (FSK).

Frequency modulation circuit 2 is formed, for example, by two capacitors C1, C2, interposed, in parallel, between quartz crystal 1 and terminal M. Each capacitor C1, C2, is respectively connected, in series, with a diode D1, D2, the cathodes of which are connected to terminal M. The anode of each diode D1, D2, is connected to the corresponding capacitor C1, C2 and, via a resistor R1, R2, to a terminal 3, 4, used to apply a control voltage V3, V4. Diodes D1 and D2 are diodes with a series impedance which is very high in their nonconductive state and very low in their on-state. When one of voltages V3, V4, is positive enough, the corresponding capacitor C1, C2, contributes, by looping back through the ground, to the capacitance present in parallel on quartz crystal 1. Thus, the frequency modulation is performed by the application of a voltage on one of terminals 3 and 4 or on both terminals.

The assembly of FIG. 2 is more specifically meant for linear modulation (FM).

Modulation circuit 2' is formed by a varicap diode Cv interposed between quartz crystal 1 and terminal M. The anode of varicap diode Cv is connected to terminal M and its cathode is connected to a terminal of quartz crystal 1 and, via a resistor R3, to a terminal 5 used to apply an oscillator control voltage V5. The frequency modulation is performed by varying voltage V5 which modifies the equivalent capacitance of varicap diode Cv.

A disadvantage of conventional Colpitts-type assemblies is that they require a relatively large area for integration and some portions are generally not integrated. Indeed, modulation circuits 2 (FIG. 1) or 2' (FIG. 2) must, in practice, be implemented in the form of circuits external to an integrated circuit including the Colpitts-type assembly itself. In particular, the implementation of a varicap diode in integrated form is very bulky.

To implement a voltage-controlled quartz oscillator in the form of a circuit where all components (except for the quartz crystal) are integrated, another type of assembly, an example of which is illustrated by FIG. 3, is generally used. The principle of such an assembly is to use a variable phase-shifter 6 on a feedback loop connecting an output S of a differential amplifier 7 to the positive input voltage of this amplifier 7. Quartz crystal 1 is connected between the negative input terminal of amplifier 7 and the ground. Variable phase-shifter 6 introduces a delay in the feedback loop. The length of this delay is controlled by a voltage V6 applied on a control terminal of phase-shifter 6. The modulated signal is taken from the output S of amplifier 7.

In such an assembly, amplifier 7 and phase-shifter 6 can be implemented in the form of an integrated circuit. However, the modulation range is much narrower than in a Colpitts-type oscillator.

FIG. 4 illustrates the impedance-frequency characteristic of a quartz crystal. A quartz crystal has two oscillation frequencies. A first fixed frequency fs corresponds to the series resonance of the quartz crystal and is a function of the intrinsic characteristics of the quartz crystal, that is, its series inductance and its series capacitance. At frequency fs, the impedance Z of the quartz crystal corresponds to its series resistance. A second oscillation frequency fp of the quartz crystal corresponds to the parallel frequency of the quartz crystal and is variable. Frequency fp is a function of the series inductance intrinsic to the quartz crystal and of the capacitance in parallel on this series inductance. Frequency fp is thus variable according to the capacitances added in parallel across the quartz crystal. At frequency fp, the quartz crystal impedance is at its maximum.

An assembly such as shown in FIG. 3 uses the series resistance of the quartz crystal, since the quartz crystal impedance must be minimum for the negative input of amplifier 7 to be substantially at the ground, as otherwise the oscillation is damped. Now, when the frequency is varied around frequency fs by means of phase-shifter 6, the quartz crystal impedance increases. It must thus be seen to it that frequency modulation range Δf is sufficiently low for the quartz crystal impedance to remain sufficiently low, so that the assembly oscillates without damping.

U.S. Pat. No. 3,728,645 discloses a quartz crystal oscillator wherein an active circuit modifies the oscillator frequency. The active circuit introduces a variable capacitance between the base of the oscillating transistor and the ground. A drawback of such a circuit is that its control necessitates a dynamic modulation and that the oscillation frequency cannot be controlled from a D.C. signal.

Another disadvantage of an assembly such as shown in FIG. 3 is that the amplitude of the modulated signal is not stable due to the quartz crystal impedance variation. Further, the central frequency (fs) of the oscillator is not settable.

Oscillators which use an odd number of series inverters, connected in parallel with a quartz crystal, having both its terminals grounded via capacitors, are also known. A switch short-circuits an even number of inverters to modify the propagation time. Such oscillators are exclusively meant for an FSK modulation.

SUMMARY OF THE INVENTION

The present invention aims at providing a novel voltage-controlled quartz oscillator which overcomes the disadvantages of conventional assemblies.

Especially, the present invention aims at providing an oscillator which can be integrated with reduced bulk.

The present invention also aims at providing an oscillator, the frequency modulation of which can be performed over a wide frequency range.

The present invention also aims at providing an oscillator, in which the amplitude of the output signal remains substantially constant, whatever the frequency.

The present invention also aims at providing an oscillator in which the oscillation frequency can be controlled by a D.C. voltage.

The present invention further aims at providing an oscillator, the structure of which is adapted to an FM modulation and to an FSK modulation.

To achieve these and other objects, the present invention provides a voltage-controlled quartz crystal oscillator, including an oscillation transistor, the base of which is connected to a first terminal of a quartz crystal and the emitter of which is connected, via a first capacitor, to a second terminal of the quartz crystal connected to a first supply terminal, and a voltage-controlled active circuit introducing a variable capacitance between the base and the emitter of the oscillation transistor.

According to an embodiment of the present invention, the oscillator includes a second capacitor connected between the base and the emitter of the oscillation transistor.

According to an embodiment of the present invention, the active circuit is formed by a structure with a differential control, receiving a modulating signal.

According to an embodiment of the present invention, the active circuit includes:

- a first modulating portion formed by a first transistor and a second transistor with common emitters, the bases of which are respectively connected to a first and to a second terminals of application of the modulating signal, and the collectors of which are connected by a modulation capacitor, the collector of the first transistor being connected, via a first series association of two resistors, to a second supply terminal, and the collector of the second transistor being connected, via a second series connection of two resistors, to the second supply terminal;
- a second modulating portion formed by a third transistor and a fourth transistor with common emitters, the bases of which are respectively connected to the second terminal and to the first terminal of application of the modulating signal, the collector of the third transistor being connected to the midpoint of the first series connection and the collector of the fourth transistor being connected to the midpoint of the second series association;
- a gain assembly with transistors, interposed between the emitters of the four first transistors and the first supply terminal; and
- at least one first loop capacitor, connected between the collector of the first transistor and the base of the oscillation transistor.

According to an embodiment of the present invention, the second midpoint is connected, via a second loop capacitor, to the base of the oscillation transistor.

According to an embodiment of the present invention, the resistors of the series connections are sized according to the desired modulation range around a central oscillation frequency.

According to an embodiment of the present invention, the gain assembly is formed of a fifth transistor and of a sixth transistor having commonly-connected bases, a collector of the fifth transistor being connected to the emitters of the first and second transistors, the collector of the sixth transistor being connected to the emitters of the third and fourth transistors, the emitter of the fifth transistor being connected to the emitter of the oscillation transistor and the emitter of the sixth transistor being connected, via a third capacitor, to the first supply terminal.

According to an embodiment of the present invention, the bases of the fifth and sixth transistors are connected, via a first base resistor, to a terminal of a source of constant voltage, the base of the oscillation transistor being also connected to the terminal of the voltage source via a second base resistor.

According to an embodiment of the present invention, the respective emitters of the oscillation transistor and of the fifth and sixth transistors are connected, via emitter resistors, to the first supply terminal.

According to an embodiment of the present invention, the transistor(s) are NPN-type transistors. The foregoing objects, features and advantages of the present invention will be discussed in detail in the following non-limiting description of specific embodiments in connection with the accompanying drawings.

DETAILED DESCRIPTION

Figure 1:
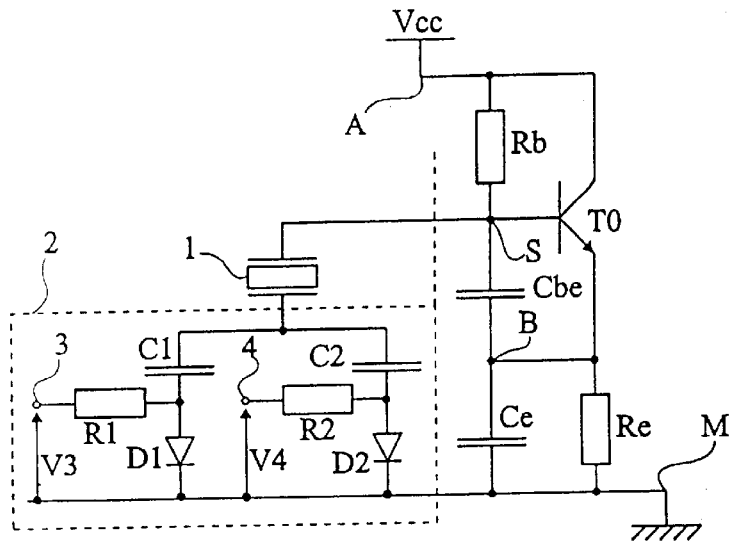
FIG. 1 shows a Colpitts-type oscillator in which the frequency is modulated, discretely, by switching capacitors in series with the quartz crystal.
Figure 2:
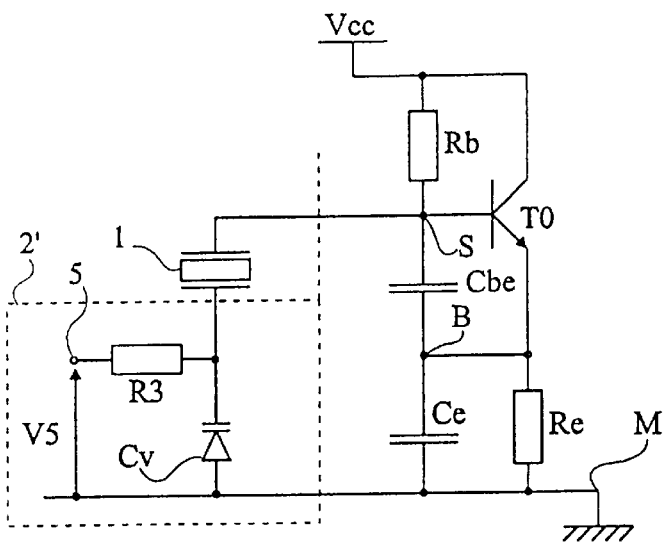
FIG. 2 shows an example of a Colpitts-type oscillator in which the frequency is modulated, linearly, by means of a variable-capacitance diode.

For clarity, the same elements have been referred to by the same reference characters in the different drawings.

Figure 5:
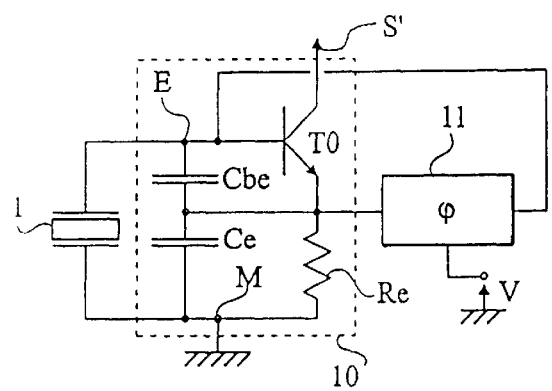
FIG. 5 schematically shows a first embodiment of a voltage-controlled quartz crystal oscillator according to the present invention.

FIG. 5 shows a simplified diagram of an embodiment of a voltage-controlled quartz crystal oscillator according to the present invention.

A characteristic of the present invention is to associate a Colpitts-type oscillator 10 with an active circuit 11 forming a variable voltage-controlled (V) phase-shifter (φ).

Colpitts-type structure 10 includes an oscillation transistor To, for example of type NPN, the emitter of which is connected, via a capacitor Ce, to a negative supply terminal M, generally grounded. The base of transistor To forms a terminal E that is connected to a first terminal of an external quartz crystal 1, a second terminal of which is connected to terminal M. A biasing resistor Re connects the emitter of transistor To to terminal M.

According to the present invention, the emitter of transistor To is also connected to an input of active phase-shifting circuit 11, an output of which is connected to the base of transistor To.

The function of active circuit 11 is to add a variable capacitance between the base and the emitter of transistor To. The value of this capacitance acts upon the oscillation frequency by modifying the capacitance connected in parallel to quartz crystal 1. Circuit 11 introduces a delay with a gain in the feedback loop between the emitter and the base of transistor To. The voltage control of circuit 11 amounts, functionally, to varying the propagation time in the loop and, thus, the equivalent capacitance added between the base and the emitter of transistor To by circuit 11.

In the embodiment shown in FIG. 5, an additional capacitor Cbe is mounted between terminal E and the emitter of transistor To to form a series connection of capacitors Cbe and Ce between terminal E and the ground, as in a conventional Colpitts oscillator. Capacitor Cbe is, according to the present invention, optional due to the equivalent capacitance brought in by circuit 11 which can, in case of need, be sufficient for the oscillator operation. The omitting of capacitor Cbe reduces the bulk of the assembly.

The modulated signal is, according to the present invention, taken from an output terminal S', connected to the collector of transistor To.

Figure 3:
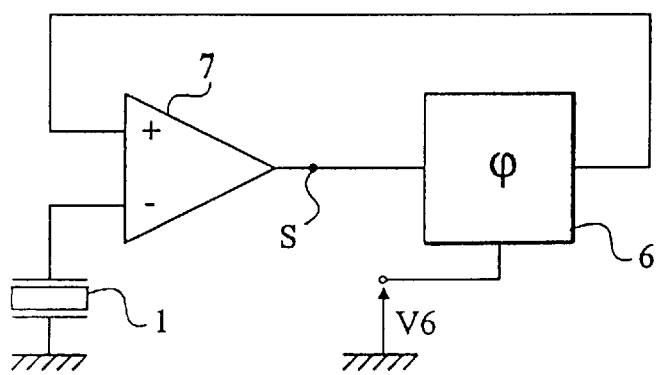
FIG. 3 illustrates a voltage-controlled quartz oscillator.
Figure 4:
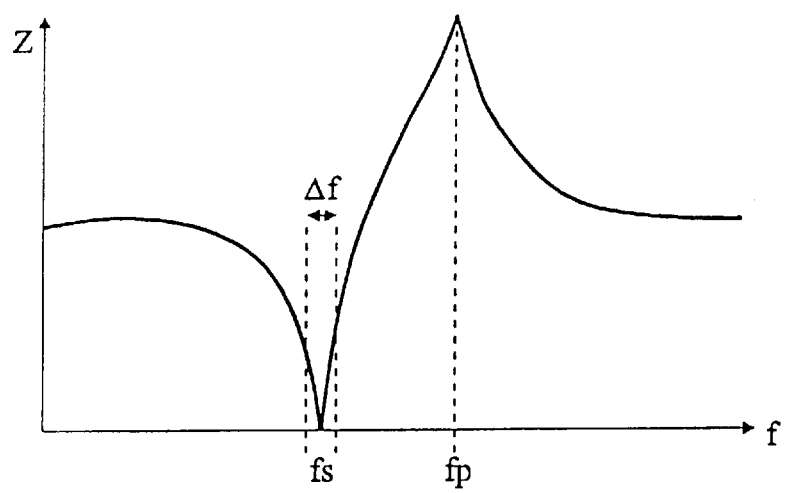
FIG. 4 illustrates the impedance-frequency characteristic of a quartz crystal.

An advantage of the present invention is to use the parallel resonance frequency (fp, FIG. 4) of quartz crystal 1 (the equivalent capacitance connected in parallel to the quartz crystal is modified), which provides a modulation range substantially larger than in a conventional phase-shifter assembly such as shown in FIG. 3.

Another advantage of the present invention is that, by varying the parallel resonance frequency of the quartz crystal to obtain the modulation, the quartz crystal impedance is maintained at a substantially constant value corresponding to its maximum value. Thus, the amplitude of the output signal provided by the oscillator is substantially constant, whatever the frequency.

Capacitor Ce and, if present, capacitor Cbe, can be integrated into the oscillator, the only external component then being the quartz crystal, or they can be external capacitors to enable the user to modify the central oscillation frequency, that is, the oscillation frequency for a phase-shift equal to the central phase-shift of the variation range of circuit 11.

Figure 6:
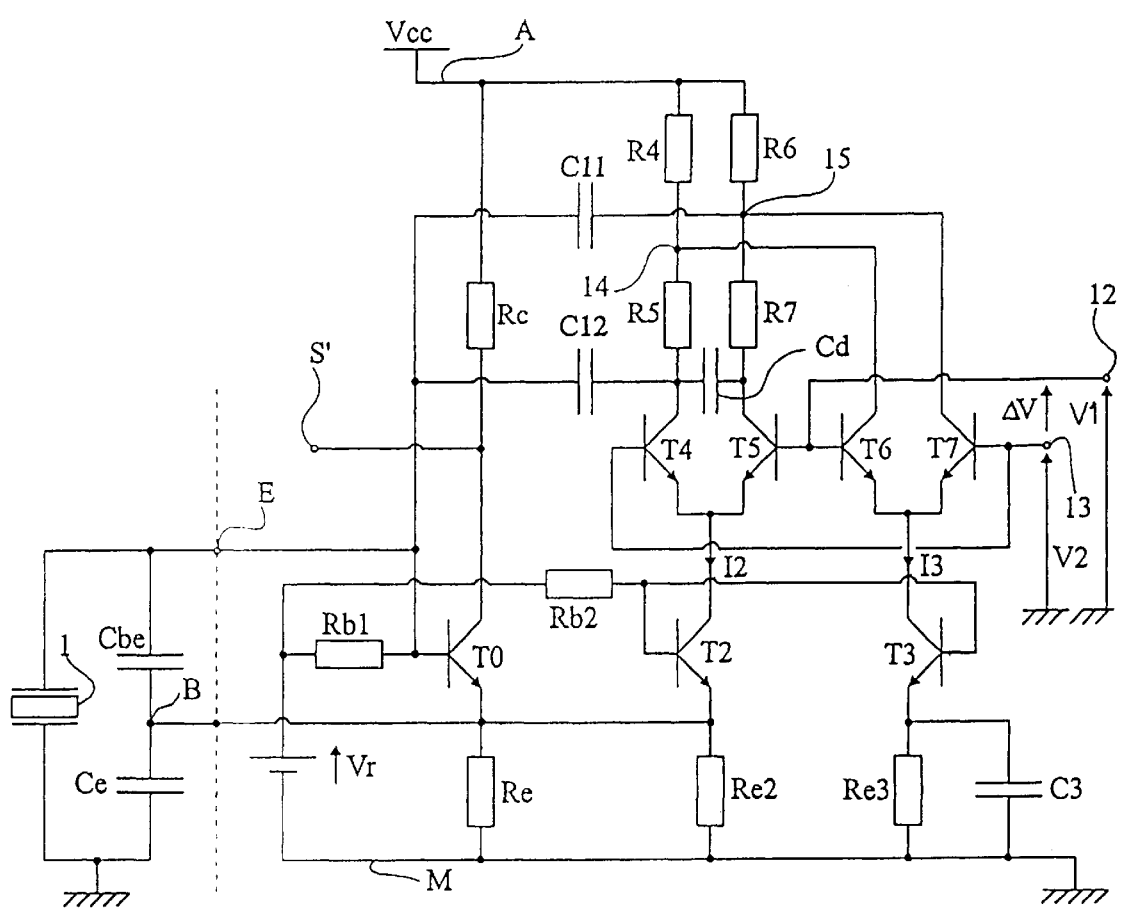
FIG. 6 shows a detailed schematic electric diagram of the oscillator shown in FIG. 5.

FIG. 6 shows a detailed schematic electric diagram of an oscillator such as shown in FIG. 5.

Circuit 11 is formed of a structure with differential inputs receiving, on two terminals 12, 13, control voltages V1, V2, the difference ΔV of which conditions the desired frequency variation with respect to central frequency f0 of the oscillator. Terminals 12 and 13 form the input terminals of the modulation signal, be it to obtain a frequency modulation (FM) or a frequency shift keying modulation (FSK) around central frequency f0.

Thus, according to the invention, the modulation of the oscillation frequency does not need a dynamic control and the oscillation frequency can be controlled by a D.C. voltage.

A first differential pair, formed of transistors T2 and T3, of NPN type, mounted as a voltage-current converter, form the gain portion of the assembly. In the example shown in FIG. 6, the bases of transistors T2 and T3 are connected together and are biased by means of a constant voltage source Vr, a negative terminal of which is connected to the ground and a positive terminal of which is connected, via a resistor Rb2, to the bases of transistors T2 and T3. Source Vr is also used to bias transistor To, its positive terminal being connected, via a resistor Rb1, to the base of transistor To. The emitters of transistors T2 and T3 are each connected, via a resistor Re2, Re3, to terminal M. A capacitor C3 is connected in parallel to resistor Re3, and the emitter of transistor T2 is connected to the emitter of transistor To.

As an alternative, the emitters of transistors T2 and T3 can be connected together. The modifications to be brought to the gain portion of the assembly for a common emitter assembly are within the abilities of those skilled in the art. The common base assembly, however, forms a preferred embodiment of the present invention since it minimizes the number of capacitors and resistors used for the gain portion of the assembly.

Each transistor T2, T3, is associated with a differential modulation stage formed by two NPN-type transistors, respectively, T4, T5, and T6, T7. The emitters of transistors T4 and T5 are connected to the collector of transistor T2. The emitters of transistors T6 and T7 are connected to the collector of transistor T3. The bases of transistors T4 and T7 are connected to terminal 13 and the bases of transistors T5 and T6 are connected to terminal 12. The collectors of transistors T4 and T5 are connected, independently and via a series connection of resistors R4, R5, and R6, R7, to a terminal A that is connected to a positive supply potential Vcc. The midpoint 14 of the series association of resistors R4 and R5 is connected to the collector of transistor T6. The midpoint 15 of the series association of resistors R6 and R7 is connected to the collector of transistor T7. A modulation capacitor Cd is connected between the collectors of transistors T4 and T5. The function of transistors T4, T5, T6, and T7 is to modulate, according to the voltages of the modulating signal, the weight of capacitor Cd in the loop formed between the emitter of transistor To and its base.

The loop closes on the base of transistor To by means of at least one first capacitor C12, connected between the collector of transistor T4 and the base of transistor To. The collector of transistor To is connected, via a biasing resistor Rc, to terminal A. If desired, a second loop capacitor C11 connects node 15 to the base of transistor To.

When voltages V1 and V2 are equal, the collector currents of transistors T4 and T5 are equal and the collector currents of transistors T6 and T7 are equal. As a result, no current flows through capacitor Cd even when the currents which flow through the branches of the differential pairs are a.c. currents. Indeed, if the assembly oscillation condition is respected as will be seen hereafter, the emitter potential of transistor To oscillates and currents I2, I3, of the collectors of transistors T2 and T3 thus are a.c. currents.

If voltage V2 is higher than voltage V1, transistors T4 and T7 are on, while transistors T5 and T6 are blocked. There results an imbalance in the distribution of currents I2 and I3 and capacitor Cd thus conducts a current. Similarly, capacitor Cd also conducts a current (in the opposite direction) when voltage V1 is higher than voltage V2. The phase-shift brought in by capacitor Cd is added on the base of transistor To by means of capacitor C12 (and, if present, C11).

For the assembly to oscillate, the real part of the impedance seen by the quartz crystal must be, in absolute value, higher than its own series resistance.

Figure 7:
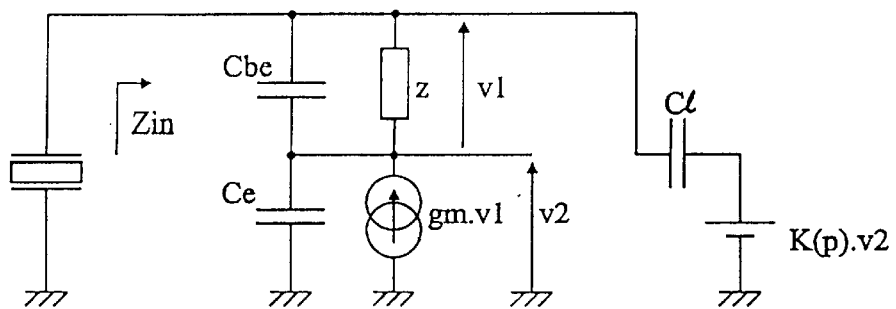
FIG. 7 shows an equivalent schematic diagram of the oscillator shown in FIG. 6.

FIG. 7 shows the simplified equivalent schematic electric diagram of the oscillator shown in FIG. 6. The differential structure (transistors T2, T3, T4, T5, T6, T7, resistors R4, R5, R6, R7, capacitor Cd and the biasing resistors of transistors T2 and T3) is modeled in the form of a voltage generator that provides a voltage K(p).v$_2$, where K(p) represents the transfer function of this differential structure and where v$_2$ represents the a.c. voltage of the emitter of transistor To. Transistor To is schematized as an impedance z (r+jcω) and a current generator gm.v$_1$, where gm represents the transconductance of transistor To and where v, represents the a.c. voltage between the base and the emitter of transistor To. For simplification, capacitors C11 and C12 have been combined into a capacitor C1. Neglecting second order terms, the impedance $Z_{in}$ seen by the quartz can be written as:

$$Z_{in} = R_{in} + \frac{1}{j \cdot C_{in} \cdot \omega}, \text{ with:}$$

$$R_{in} = \frac{-gm}{[(Cbe+c)Ce+(Cbe+c+Ce)C1-K(j\omega)(Cbe+c)C1]\omega^2};$$

and $$C_{in} = \frac{(Cbe+c) \cdot Ce}{(Cbe+c)+Ce} + C1 - K(j\omega) \cdot \frac{(Cbe+c) \cdot C1}{(Cbe+c)+Ce}.$$

Since $C_{in}$ is a function of K(p), the frequency also depends on the transfer function of the differential structure.

Transfer function K(p) can be written as:

K(p)=K1.th(-ΔV/2Vt)+K2.th(-ΔV/2Vt)-K3/[1+exp(-ΔV/2Vt)], where K1 represents a constant depending on the transconductance of transistor T2 or T3, resistances R4, R5, R6, and R7 and capacitor Cd;

where Vt=kT/Q, where k represents Boltzman's constant, Q the electron charge, and T the temperature in Kelvin;

where K2 represents a constant depending on the transconductance of transistor T2 or T3, and on resistance R4 or R6; and where K3 represents a constant depending on the transconductance of transistor T2 or T3, and resistance R5 or R7.

As a result of the transfer function of the differential structure, when ΔV=0, the hyperbolic tangent of expression ΔV/2Vt is zero and the first term depending on capacitor Cd thus is zero. The transfer function of the differential structure is then independent from capacitor Cd, and the oscillation frequency corresponds to central frequency f0.

When the differential voltage ΔV varies, transfer function K(p) also varies and, accordingly, the imaginary part of impedance $Z_{in}$ varies, which modifies the oscillation frequency.

Figure 8:
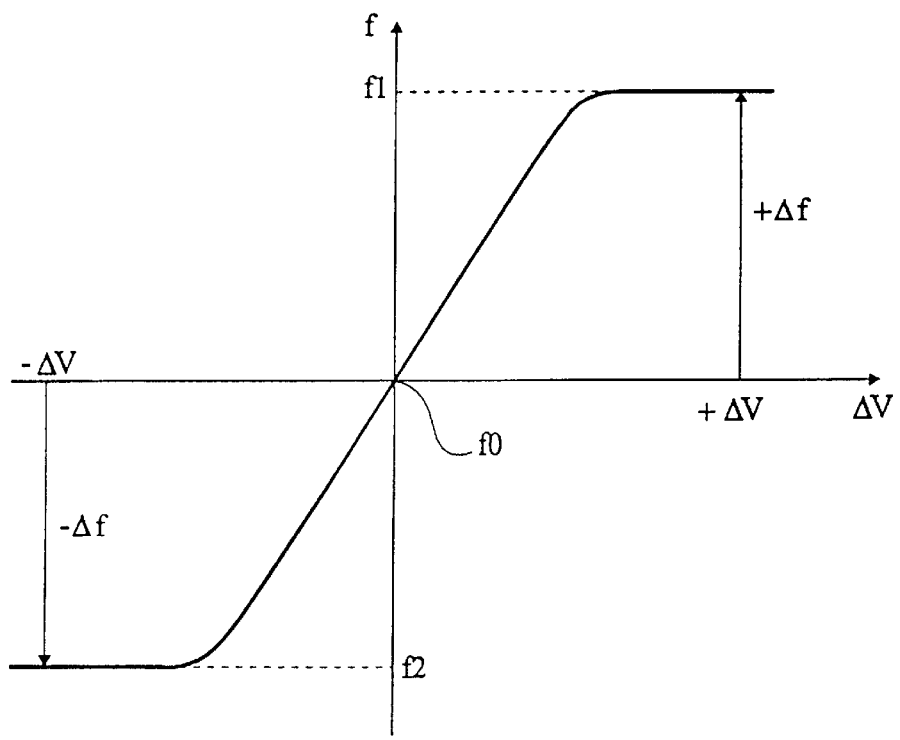
FIG. 8 illustrates the differential frequency-voltage characteristic of an oscillator according to the present invention.

FIG. 8 shows the differential frequency-voltage control characteristic of an oscillator such as shown in FIG. 6.

This characteristic frequency f has a portion that linearly increases between two asymptote values f1 and f2 on either side of central frequency f0. In the example shown in FIG. 8, it is assumed that resistors R4, R5, R6, and R7 have been sized so that the characteristic is symmetrical with respect to frequency f0.

It should, however, be noted that the ranges of increase +Δf and decrease -Δf of the frequency with respect to central frequency f0 can be made asymmetrical by modifying the values of the resistors.

As can be seen from FIG. 8, the oscillator according to the present invention can operate either in FM modulation, or in FSK modulation. For an FM modulation operation, the differential voltage is varied along the linear portion of the characteristic. Conversely, for an FSK modulation, it will be preferred to vary the differential voltage between two values +ΔV and -ΔV sufficiently high for the corresponding frequencies to be located in the asymptotic portions of the characteristic. This makes the two frequencies of the FSK modulation independent from possible variations of the high and low voltages, respectively, of the modulating signal.

It should be noted that central frequency f0 and the frequency variation range must be such that the frequency of the modulated signal is always higher than the series resonance frequency of the quartz crystal used.

An advantage of the present invention is that the oscillator is entirely programmable while keeping an identical structure. The sizing of the components of the phase-shifter circuit will, however, have to be adapted to the central frequency f0 selected for the oscillator. This central frequency also depends on capacitors Cbe and Ce.

Another advantage of the present invention is that the provided oscillator structure can operate under a low supply voltage Vcc on the order of 2.7 volts.

Of course, the present invention is likely to have various alterations, modifications, and improvements which will readily occur to those skilled in the art. Especially, the sizing of the different components will be chosen according to the desired central frequency, and thus to the quartz frequency. Further, an inductance and/or a capacitor could conventionally be added in series with the quartz crystal.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage-controlled quartz crystal oscillator, including an oscillation transistor, a base of which is connected to a first terminal of a quartz crystal and an emitter of which is connected, via a first capacitor, to a second terminal of the quartz crystal connected to a first supply terminal, and including an active circuit introducing a variable capacitance between the base and the emitter of the oscillation transistor, the active circuit being voltage-controlled, wherein the active circuit is formed by a structure with a differential control, receiving a modulating signal, said active circuit comprising at least a first differential transistor pair including at least a first transistor and a second transistor and means coupling said first differential transistor pair to said oscillation transistor to provide a variable capacitance between the base and emitter of the oscillation transistor.

2. The oscillator of claim 1, including a second capacitor connected between the base and the emitter of the oscillation transistor.

3. The oscillator of claim 1, wherein said means coupling comprises a circuit for coupling the differential transistor pair across the base-to-emitter junction of the oscillation transistor.

4. A voltage-controlled quartz crystal oscillator, including an oscillation transistor, a base of which is connected to a first terminal of a quartz crystal and an emitter of which is connected, via a first capacitor, to a second terminal of the quartz crystal connected to a first supply terminal, and including an active circuit introducing a variable capacitance between the base and the emitter of the oscillation transistor, the active circuit being voltage-controlled wherein the active circuit is formed by a structure with a differential control, receiving a modulating signal and wherein the active circuit includes:

a first modulating portion formed by a first transistor and a second transistor with common emitters, bases of which are respectively connected to first and second terminals of application of the modulating signal, and the collectors of which are connected by a modulation capacitor, a collector of the first transistor being connected, via a first series connection of two resistors, to a second supply terminal, and a collector of the second transistor being connected, via a second series connection of two resistors, to the second supply terminal;

a second modulating portion formed by a third and a fourth transistor with common emitters, bases of which are respectively connected to the second terminal and to the first terminal of application of the modulating signal, the collector of the third transistor being connected to a first midpoint of the first series connection and the collector of the fourth transistor being connected to a second midpoint of the second series connection;

a gain assembly with transistors, interposed between emitters of the four active circuit transistors and the first supply terminal; and at least one first loop capacitor, connected between the collector of the first transistor and the base of the oscillation transistor.

5. The oscillator of claim 4, wherein the second midpoint is connected, via a second loop capacitor, to the base of the oscillation transistor.

6. The oscillator of claim 4, wherein the resistors of the series connections are sized according to the desired modulation range around a central oscillation frequency.

7. The oscillator of claim 4, wherein the gain assembly is formed of a fifth transistor and of a sixth transistor having commonly-connected bases, a collector of the fifth transistor being connected to the emitters of the first and second transistors, a collector of the sixth transistor being connected to the emitters of the third and fourth transistors, an emitter of the fifth transistor being connected to the emitter of the oscillation transistor and an emitter of the sixth transistor being connected, via a third capacitor, to the first supply terminal.

8. The oscillator of claim 7, wherein bases of the fifth and sixth transistors are connected, via a first base resistor, to a terminal of a source of constant voltage, the base of the oscillation transistor being also connected to the terminal of the voltage source via a second base resistor.

9. The oscillator of claim 7, wherein the respective emitters of the oscillation transistor and of the fifth and sixth transistors are connected, via emitter resistors, to the first supply terminal.

10. The oscillator of claim 9, wherein the transistor(s) are NPN-type transistors.

11. A voltage-controlled quartz crystal oscillator, comprising:

an oscillation transistor having at least a control terminal and a main terminal;

a quartz crystal having first and second terminals;

a capacitance circuit intercoupling the oscillation transistor and the quartz crystal;

and an active circuit coupled to said oscillation transistor and having a voltage-controlled input terminal;

said active circuit providing a variable capacitance between the control and main terminals of the oscillation transistor, said active circuit comprising at least a first differential transistor pair including at least a first transistor and a second transistor and means coupling said first differential transistor pair to said oscillation transistor to provide a variable capacitance between the control and main terminals of the oscillation transistor.

12. The oscillator of claim 11, wherein the control terminal of the oscillation transistor is the base of the transistor, and is coupled to the first terminal of the quartz crystal.

13. The oscillator of claim 12, wherein said capacitance circuit includes a first capacitor intercoupling the main terminal of the oscillation transistor to the second terminal of the quartz crystal.

14. The oscillator of claim 13, wherein the second terminal of the quartz crystal is connected to a first supply terminal.

15. The oscillator of claim 14, wherein the main terminal of the oscillation transistor is the emitter of the oscillation transistor.

16. The oscillator of claim 15, including a second capacitor connected between the base and emitter of the oscillation transistor.

17. The oscillator of claim 16, wherein the voltage control input terminal receives a modulating signal.

18. A voltage-controlled quartz crystal oscillator, comprising:

an oscillation transistor having at least a control terminal and a main terminal;

a quartz crystal having first and second terminals;

a capacitance circuit intercoupling the oscillation transistor and the quartz crystal;

and an active circuit coupled to said oscillation transistor and having a voltage-controlled input terminal;

said active circuit providing a variable capacitance between the control and main terminals of the oscillation transistor, wherein the control terminal of the oscillation transistor is the base of the transistor, and is coupled to the first terminal of the quartz crystal;

said capacitance circuit includes a first capacitor intercoupling the main terminal of the oscillation transistor to the second terminal of the quartz crystal;

the second terminal of the quartz crystal is connected to a first supply terminal;

the main terminal of the oscillation transistor is the emitter of the oscillation transistor;

including a second capacitor connected between the base and emitter of the oscillation transistor;

the voltage control input terminal receives a modulating signal; and wherein the active circuit includes a first modulating portion formed by a first transistor and a second transistor and a second modulating portion formed by a third transistor and fourth transistor.

19. The oscillator of claim 18, wherein the voltage control input terminal includes both first and second modulation terminals, said first and second transistors having common emitters and having bases thereof respectively connected to the first and second terminals for application of the modulating signal.

20. The oscillator of claim 19, further including a modulation capacitor, a first series of two resistors and a second series of two resistors.

21. The oscillator of claim 20, wherein the collectors of the first and second transistors are connected by a modulation capacitor, the collector of the first transistor being connected, via the first series connection of resistors to a second supply terminal, and a collector of the second transistor being connected, via the second series connection of two resistors to the second supply terminal.

22. The oscillator of claim 21, wherein said third and fourth transistors have common emitters, the bases of which are respectively connected to the second terminal and to the first terminal of application of the modulating signal.

23. The oscillator of claim 22, where in the collector of the third transistor is connected to a first midpoint of the first series connection of resistors and the collector of the fourth transistor is connected to a second midpoint of the second series connection of two resistors.

24. The oscillator of claim 23, further including a gain assembly with a pair of transistors interposed between the emitters of the of the active circuit transistors and the first supply terminal.

25. The oscillator of claim 24, further including at least one first loop capacitor connected between a collector of the first transistor and the base of the oscillation transistor.

26. The oscillator of claim 25, wherein the second midpoint is connected, via a second loop capacitor to the base of the oscillation transistor.

27. The oscillator of claim 26, wherein the resistors of the series connections are sized according to the desired modulation range around a central oscillation frequency.

28. The oscillator of claim 27, wherein the gain assembly is formed of a fifth transistor and of a sixth transistor having commonly connected bases, a collector of the fifth transistor being connected to the emitters of the first and second transistors, a collector of the sixth transistor being connected to the emitters of the third and fourth transistors, an emitter of the fifth transistor being connected to the emitter of the oscillation transistor and an emitter of the sixth transistor being connected, via a third capacitor, to the first supply terminal.

29. The oscillator of claim 28, wherein bases of the fifth and sixth transistors are connected, via a first base resistor, to a terminal of a source of constant voltage, the base of the oscillation transistor being also connected to the terminal of the voltage source via a second base resistor.

30. The oscillator of claim 29, wherein the respective emitters of the oscillation transistor and of the fifth and sixth transistors are connected, via emitter resistors, to the first supply terminal.

31. The oscillator of claim 30, wherein all the transistor(s) are NPN-type transistors.

32. A voltage-controlled quartz crystal oscillator, comprising:
an oscillation transistor means having at least a control terminal and a main terminal;
a quartz crystal means having first and second terminals;
a capacitance circuit means intercoupling the oscillation transistor means and the quartz crystal;
and an active circuit means coupled to said oscillation transistor means and having a voltage-controlled input terminal;
said active circuit means providing a variable capacitance between the control and main terminals of the oscillation transistor means
said active circuit means comprising at least a first differential transistor pair including at least a first transistor and a second transistor and means coupling said first differential transistor pair to said oscillation transistor means to provide a variable capacitance between the control and main terminals of the oscillation transistor means.

33. The oscillator of claim 32, wherein the control terminal of the oscillation transistor means is the base of the transistor, and is coupled to the first terminal of the quartz crystal means.

34. The oscillator of claim 33, wherein said capacitance circuit means includes a first capacitor means intercoupling the main terminal of the oscillation transistor means to the second terminal of the quartz crystal means.

35. The oscillator of claim 34, wherein the second terminal of the quartz crystal means is connected to a first supply terminal.

36. The oscillator of claim 35, wherein the main terminal of the oscillation transistor means is the emitter of the oscillation transistor means.

37. The oscillator of claim 36, including a second capacitor means connected between the base and emitter of the oscillation transistor means.

38. The oscillator of claim 37, wherein the voltage control input terminal receives a modulating signal.

39. A voltage-controlled quartz crystal oscillator, comprising:
an oscillation transistor means having at least a control terminal and a main terminal;
a quartz crystal means having first and second terminals;
a capacitance circuit means intercoupling the oscillation transistor means and the quartz crystal;
and an active circuit means coupled to said oscillation transistor means and having a voltage-controlled input terminal;
said active circuit means providing a variable capacitance between the control and main terminals of the oscillation transistor means;
wherein the control terminal of the oscillation transistor means is the base of the transistor, and is coupled to the first terminal of the quartz crystal;
said capacitance circuit includes a first capacitor means intercoupling the main terminal of the oscillation transistor means to the second terminal of the quartz crystal means;
the second terminal of the quartz crystal means is connected to a first supply terminal;
the main terminal of the oscillation transistor means is the emitter of the transistor means;
including a second capacitor means connected between the base and emitter of the oscillation transistor means;
the voltage control input terminal means receives a modulating signal means; and
wherein the active circuit includes a first modulating means portion formed by a first transistor means and a second transistor means and a second modulating portion formed by a third transistor means and fourth transistor means.

40. The oscillator of claim 11 wherein said means coupling comprises a circuit for coupling the differential transistor pair across the control and main terminals of the oscillation transistor.

41. A voltage-controlled quartz crystal oscillator, comprising:

an oscillation transistor having at least a control terminal and a main terminal;

a quartz crystal having first and second terminals;

a capacitance circuit intercoupling the oscillation transistor and the quartz crystal;

and an active circuit coupled to said oscillation transistor and having a voltage-controlled input terminal;

said active circuit providing a variable capacitance between the control and main terminals of the oscillation transistor, wherein the active circuit includes a first modulating portion formed by a first transistor and a second transistor and a second modulating portion formed by a third transistor and fourth transistor.

42. A voltage-controlled quartz crystal oscillator, comprising:

an oscillation transistor means having at least a control terminal and a main terminal;

a quartz crystal means having first and second terminals;

a capacitance circuit means intercoupling the oscillation transistor means and the quartz crystal;

and an active circuit means coupled to said oscillation transistor means and having a voltage-controlled input terminal;

said active circuit means providing a variable capacitance between the control and main terminals of the oscillation transistor means;

wherein the active circuit includes a first modulating means portion formed by a first transistor means and a second transistor means and a second modulating portion formed by a third transistor means and fourth transistor means.

* * * * *